United States Patent [19]
Schantz et al.

[11] Patent Number: 5,481,194
[45] Date of Patent: Jan. 2, 1996

[54] FAULT DETECTION CIRCUIT FOR SENSING LEAKAGE CURRENTS BETWEEN POWER SOURCE AND CHASSIS

[75] Inventors: David L. Schantz, Ellicott City; James L. Munro, Severna Park, both of Md.

[73] Assignee: Westinghouse Electric Corp., Baltimore, Md.

[21] Appl. No.: 258,179

[22] Filed: Jun. 10, 1994

[51] Int. Cl.[6] ................................................ G01R 31/02
[52] U.S. Cl. .......................... 324/522; 324/509; 324/713; 340/650; 361/42
[58] Field of Search ...................................... 324/509, 510, 324/511, 522, 523, 545, 713, 772; 361/42, 86; 307/326; 340/650

[56] References Cited

U.S. PATENT DOCUMENTS

| 3,737,765 | 6/1973 | Lee et al. | 340/650 X |
|---|---|---|---|
| 3,868,566 | 2/1975 | Parsons et al. | 324/510 |
| 4,114,622 | 9/1978 | Gonzer | 361/42 X |
| 4,398,188 | 8/1983 | Feigal et al. | 340/650 |
| 4,809,123 | 2/1989 | Allington et al. | 324/509 X |
| 5,382,946 | 1/1995 | Gale | 324/510 X |

FOREIGN PATENT DOCUMENTS 2262005  6/1993  United Kingdom ............. 307/326

*Primary Examiner*—Kenneth A. Wieder
*Assistant Examiner*—Diep Do

[57] ABSTRACT

A fault detection circuit for detecting leakage currents between a DC power source and chassis of an automobile, includes a voltage sensor coupled to the DC power source, the voltage sensor including an analog reference and a chassis ground. A differential amplifier is coupled to the voltage sensor and detects variations in the analog reference and the chassis ground. A voltage comparator unit determines whether the variations detected in the differential amplifier is above a predetermined threshold value. A built-in test circuit tests whether the fault detection circuit is operating correctly.

19 Claims, 6 Drawing Sheets

FAULT DETECTION CIRCUIT FOR SENSING LEAKAGE CURRENTS BETWEEN POWER SOURCE AND CHASSIS

RELATED APPLICATIONS

The following identified U.S. patent applications are filed on the same date as the instant application and are relied upon and incorporated by reference in this application.

U.S. patent application entitled "Flat Topping Concept" bearing attorney docket No. 58,295 and U.S. patent application Ser. No. 08/258,295, and filed on the same date herewith;

U.S. patent application entitled "Electric Induction Motor And Related Method Of Cooling" bearing attorney docket No. 58,332 and U.S. patent application Ser. No. 08/258,150, and filed on the same date herewith;

U.S. patent application entitled "Automotive 12 Volt System For Electric Vehicles" bearing attorney docket No. 58,333 and U.S. patent application Ser. No. 08/258,142, and filed on the same date herewith;

U.S. patent application entitled "Direct Cooled Switching Module For Electric Vehicle Propulsion System" bearing attorney docket No. 58,334 and U.S. patent application Ser. No. 08/258,027, and filed on the same date herewith;

U.S. patent application entitled "Electric Vehicle Propulsion System" bearing attorney docket No. 58,335 and U.S. patent application Ser. No. 08/258,301, and filed on the same date herewith;

U.S. patent application entitled "Speed Control and Bootstrap Technique For High Voltage Motor Control" bearing attorney docket No. 58,336 and U.S. patent application Ser. No. 08/258,294, and filed on the same date herewith;

U.S. patent application entitled "Vector Control Board For An Electric Vehicle Propulsion System Motor Controller" bearing attorney docket No. 58,337 and U.S. patent application Ser. No. 08/258,306, and filed on the same date herewith;

U.S. patent application entitled "Digital Pulse Width Modulator With Integrated Test And Control" bearing attorney docket No. 58,338 and U.S. patent application Ser. No. 08/258,305, and filed on the same date herewith;

U.S. patent application entitled "Control Mechanism For Electric Vehicle" bearing attorney docket No. 58,339 and U.S. patent application Ser. No. 08/258,149, and filed on the same date herewith;

U.S. patent application entitled "Improved EMI Filter Topology for Power Inverters" bearing attorney docket No. 58,340 and U.S. patent application Ser. No. 08/258,153, and filed on the same date herewith;

U.S. patent application entitled "Electric Vehicle Relay Assembly" bearing attorney docket No. 58,342 and U.S. patent application Ser. No. 08/258,117, and filed on the same date herewith;

U.S. patent application entitled "Three Phase Power Bridge Assembly" bearing attorney docket No. 58,343 and U.S. patent application Ser. No. 08/258,033, and filed on the same date herewith;

U.S. patent application entitled "Electric Vehicle Propulsion System Power Bridge With Built-In Test" bearing attorney docket No. 58,344 and U.S. patent application Ser. No. 08/258,034, and filed on the same date herewith;

U.S. patent application entitled "Method For Testing A Power Bridge For An Electric Vehicle Propulsion System" bearing attorney docket No. 58,345 and U.S. patent application Ser. No. 08/258,178, and filed on the same date herewith;

U.S. patent application entitled "Electric Vehicle Power Distribution Module" bearing attorney docket No. 58,346 and U.S. patent application Ser. No. 08/258,157, and filed on the same date herewith;

U.S. patent application entitled "Electric Vehicle Chassis Controller" bearing attorney docket No. 58,347 and U.S. patent application Ser. No. 08/258,628, and filed on the same date herewith;

U.S. patent application entitled "Electric Vehicle System Control Unit Housing" bearing attorney docket No. 58,348 and U.S. patent application Ser. No. 08/258,156, and filed on the same date herewith;

U.S. patent application entitled "Low Cost Fluid Cooled Housing For Electric Vehicle System Control Unit" bearing attorney docket No. 58,349 and U.S. patent application Ser. No. 08/258,299, and filed on the same date herewith;

U.S. patent application entitled "Electric Vehicle Coolant Pump Assembly" bearing attorney docket No. 58,350 and U.S. patent application Ser. No. 08/258,296, and filed on the same date herewith;

U.S. patent application entitled "Heat Dissipating Transformer Coil" bearing attorney docket No. 58,351 and U.S. patent application Ser. No. 08/258,141, and filed on the same date herewith;

U.S. patent application entitled "Electric Vehicle Battery Charger" bearing attorney docket No. 58,352 and U.S. patent application Ser. No. 08/258,154, and filed on the same date herewith.

BACKGROUND OF THE INVENTION

Field of the Invention

The present invention relates generally to an electric vehicle fault detection circuit for sensing leakage currents. More particularly, the present invention relates to a fault detection circuit for sensing leakage currents between a power source and a chassis of an electric vehicle. While the invention is subject to a wide range of applications, it is especially suited for use in electric vehicles that utilize batteries or a combination of batteries and other sources, e.g., a heat engine coupled to an alternator, as a source of power, and will be particularly described in that connection.

Discussion of Related Art

For an electric vehicle to be commercially viable, its cost and performance should be competitive with that of its gasoline-powered counterparts. Typically, the vehicle's propulsion system and battery are the main factors which contribute to the vehicle's cost and performance competitiveness.

Generally, to achieve commercial acceptance, an electric vehicle propulsion system should provide the following features: (1) vehicle performance equivalent to typical gasoline-powered propulsion systems; (2) smooth control of vehicle propulsion; (3) regenerative braking; (4) high efficiency; (5) low cost; (6) self-cooling; (7) electromagnetic interference (EMI) containment; (8) fault detection and self-protection; (9) self-test and diagnostics capability; (10) control and status interfaces with external systems; (11) safe operation and maintenance; (12) flexible battery charging capability; and (13) auxiliary 12 volt power from the main battery. In prior practice, however, electric vehicle propulsion system design consisted largely of matching a motor and controller with a set of vehicle performance goals, such that performance was often sacrificed to permit a practical motor and controller design. Further, little attention was given to the foregoing features that enhance commercial acceptance.

For example, a typical conventional electric vehicle propulsion system consisted of a DC motor, a chopper-type motor controller, an independent battery charger, and a distributed set of controls and status indicators. Vehicle performance was generally inadequate for highway driving, acceleration was uneven, and manual gear-changes were required. In addition, the issues of volume production cost, EMI, fault detection, maintenance, control and status interfaces, and safety were generally not addressed in a comprehensive manner.

The batteries in electric vehicles are not referenced to the chassis as in traditional internal combustion vehicles with 12 volt storage batteries. In particular, neither battery terminal in the electric vehicles is connected to the chassis to prevent the user (referenced to the chassis) from being shocked by touching either of the battery terminals (power rails) independently. However, if a leakage current flows between any one of the battery terminals and the chassis of the vehicle, dangerous levels of current may flow in the chassis. If a user comes in contact with the other terminal while in contact with any part of the chassis, serious injury may occur from electric shock.

Current leakage from a terminal to the chassis could occur from, for example, corrosion at the terminals or faulty circuits that allow current to flow between the power points (rails) and the chassis. This is a serious problem which must be detected to ensure safety to anyone coming in contact with the vehicle chassis.

Accordingly, a circuit is necessary to detect these leakages before they increase to the point where dangerous current levels are flowing in the chassis, thereby posing a threat to a person coming in contact with the chassis. Also, since the circuit will determine the safety of the system, a built-in-test capability is necessary to ensure that the circuit is operating properly.

SUMMARY OF THE INVENTION

Accordingly, the present invention is directed to a fault detection circuit that substantially obviates one or more of the problems due to limitations and disadvantages of the prior art.

An advantage of the present invention is the provision of an arrangement which substantially obviates one or more of the limitations and disadvantages of the described prior art.

Another advantage of the present invention is the provision of a fault detection circuit to detect current leakage from any one of the battery terminals to the chassis of a vehicle.

Another advantage of the present invention is the provision of a built-in test capability to ensure correct operation of the fault detection circuit.

The features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof as well as the appended drawings.

To achieve these and other advantages, and in accordance with the purpose of the invention, as embodied and broadly described, a fault detection circuit for detecting leakage currents between a DC power source and chassis of an automobile, comprises a voltage sensor coupled to the DC power source, the voltage sensor including an analog reference and a chassis ground; a differential amplifier coupled to the voltage sensor for detecting variations in the analog reference and the chassis ground; and a voltage comparator unit for determining whether the variations detected in the differential amplifier is above a predetermined threshold value.

In another aspect, the fault detection circuit of the present invention further comprises a built-in test circuit, coupled to the differential amplifier, for testing whether the fault detection circuit is operating correctly.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention, and together with the description serve to explain the principles of the invention.

DETAILED DESCRIPTION OF THE PREFERRED EMBODIMENTS

Reference will now be made in detail to the present preferred embodiment of the invention, an example of which is illustrated in the accompanying drawings.

Figure 1:
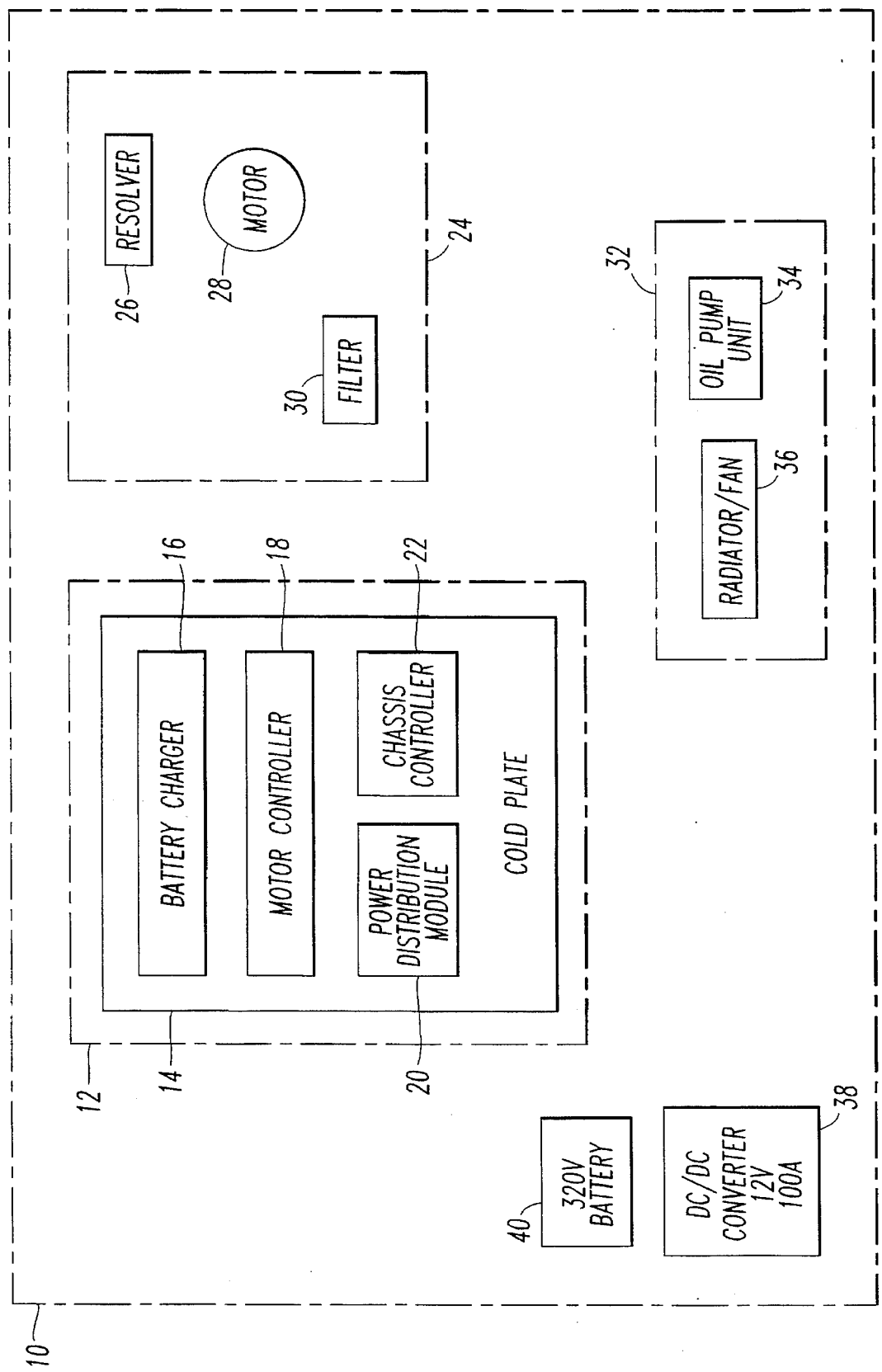
FIG. 1 is a block diagram of an electric vehicle propulsion system in accordance with a preferred embodiment of the invention.

As shown in FIG. 1, there is provided an electric vehicle propulsion system 10 comprising a system control unit 12, a motor assembly 24, a cooling system 32, a battery 40, and a DC/DC converter 38. The system control unit 12 includes a cold plate 14, a battery charger 16, a motor controller 18, a power distribution module 20, and a chassis controller 22. The motor assembly 24 includes a resolver 26, a motor 28, and a filter 30. The cooling system 32 includes an oil pump unit 34 and a radiator/fan 36.

Figure 2:
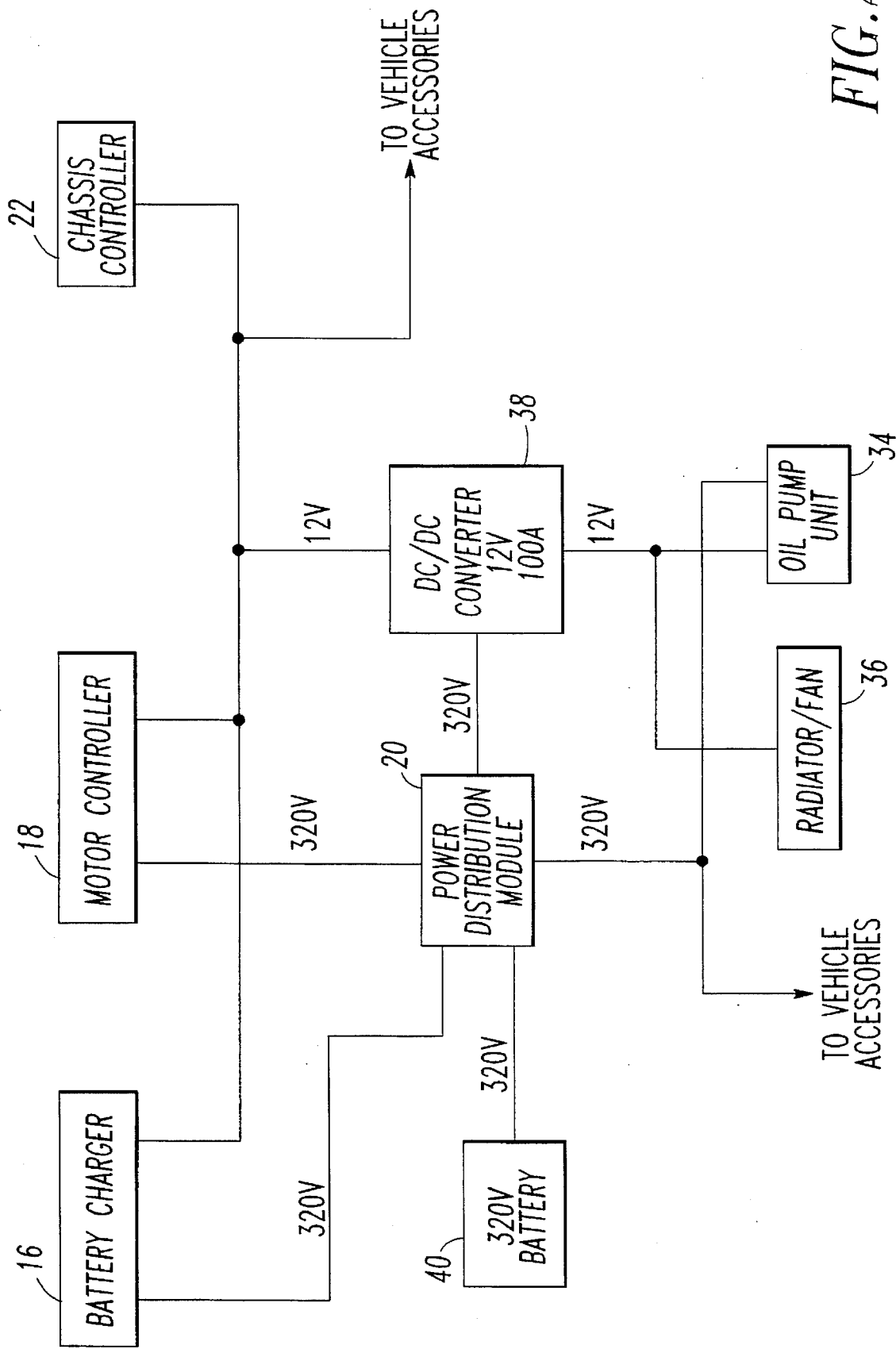
FIG. 2 is a power distribution diagram of the electric vehicle propulsion system of FIG. 1.

FIG. 2 is a power distribution diagram of the electric vehicle propulsion system 10. As shown in FIG. 2, the battery 40 serves as the primary source of power for the electric propulsion system 10. The battery 40 comprises, for example, a sealed lead acid battery, a monopolar lithium metal sulfide battery, a bipolar lithium metal sulfide battery, or the like, for providing a 320 volt output. Preferably, the electric propulsion system 10 works over a wide voltage range, e.g., 120 volts to 400 volts, to accommodate changes in the output voltage of the battery 40 due to load or depth of discharge. However, the electric vehicle propulsion system 10 is preferably optimized for nominal battery voltages of about 320 volts.

The power distribution module 20 is coupled to the output of the battery 40 and includes, among other things, fuses, wiring, and connectors for distributing the 320 volt output from the battery 40 to various components of the electric vehicle propulsion system 10. For example, the power distribution module 20 distributes the 320 volt output from the battery 40 to the motor controller 18, the DC/DC converter 38, the oil pump unit 34, and the battery charger 16. The power distribution module 20 also distributes the 320 volt output from the battery 40 to various vehicle accessories, which are external to the electric vehicle propulsion system 10. These vehicle accessories include, for example, an air conditioning system, a heating system, a power steering system, and any other accessories that may require a 320 volt power supply.

The DC/DC converter 38, which, as described above, is coupled to the 320 volt output of the power distribution module 20, converts the 320 volt output of the power distribution module 20 to 12 volts. The DC/DC converter 38 then supplies its 12 volt output as operating power to the battery charger 16, the motor controller 18, the chassis controller 22, the oil pump unit 34 and the radiator/fan 36. The DC/DC converter 38 also supplies its 12 volt output as operating power to various vehicle accessories, which are external to the electric vehicle propulsion system 10. These vehicle accessories include, for example, vehicle lighting, an audio system, and any other accessories that may require a 12 volt power supply. It should be appreciated that the DC/DC converter 38 eliminates the need for a separate 12 volt storage battery.

Figure 3:
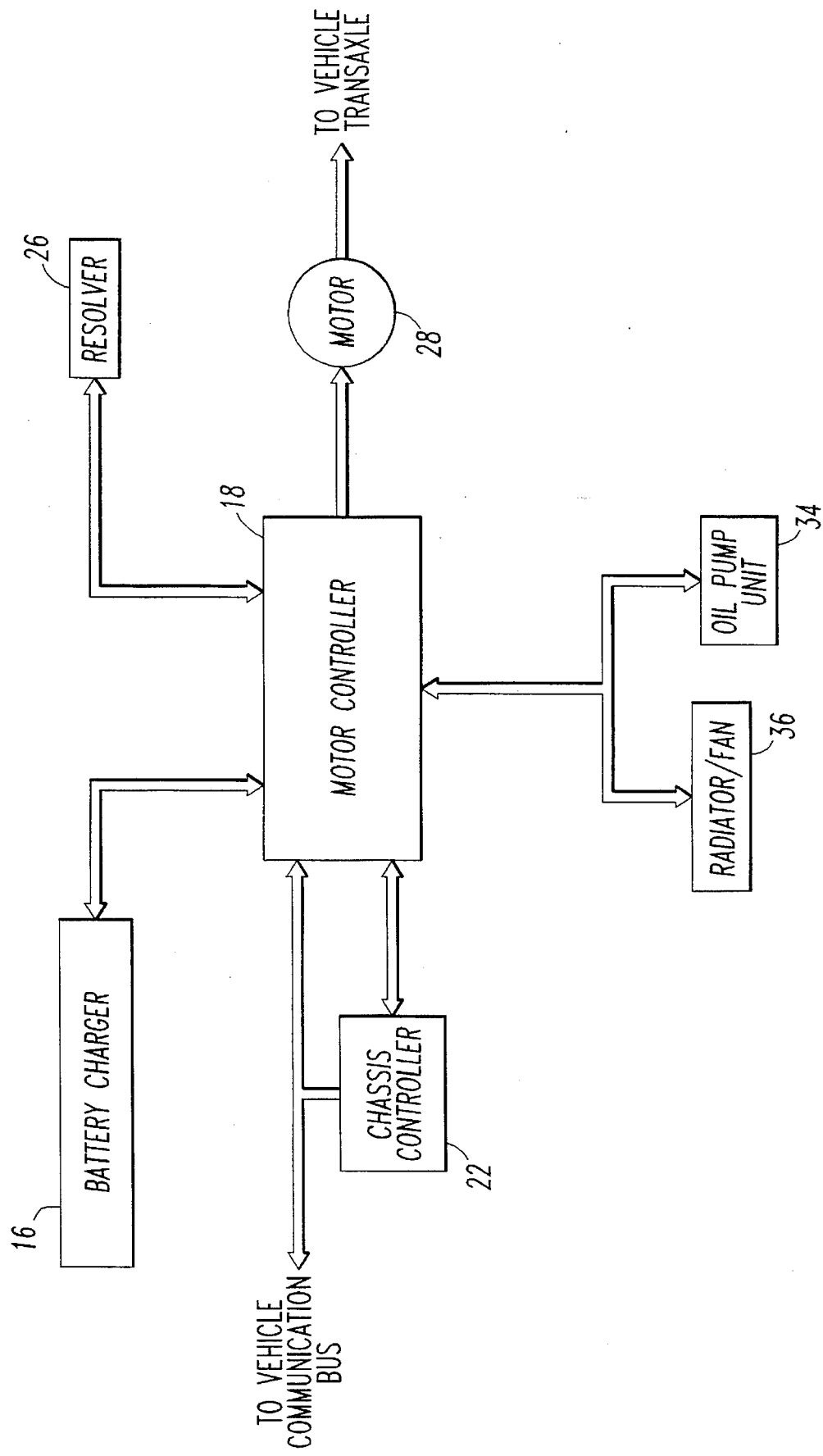
FIG. 3 is a functional diagram of the electric vehicle propulsion system of FIG. 1.
Figure 4:
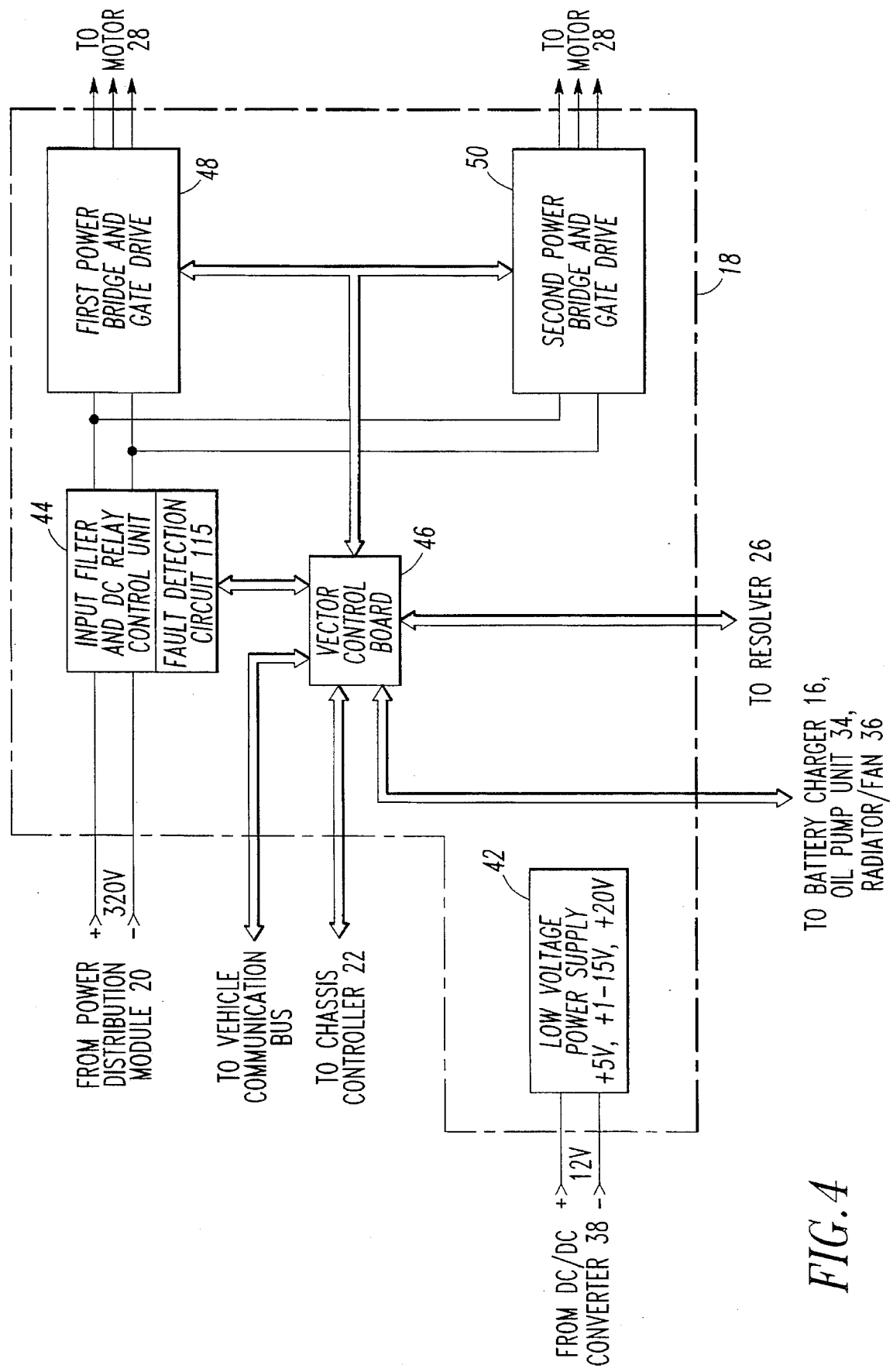
FIG. 4 is a functional diagram of the motor controller of the electric vehicle propulsion system of FIG. 1.

As shown in FIGS. 3 and 4, the components of the electric vehicle propulsion system 10 are interconnected via various data busses. The data busses can be of the electrical, optical, or electro-optical type as is known in the art. Operation of the electric vehicle propulsion system 10 will now be described with reference to FIGS. 3 and 4.

The battery charger 16 receives command signals from and sends status signals to the motor controller 18 for charging the battery 40. The battery charger 16 provides a controlled battery charging current from an external AC power source (not shown). Preferably, AC current is drawn from the external source at near-unity power factor and low harmonic distortion in compliance with expected future power quality standards. Further, the battery charger 16 is preferably designed to be compatible with standard ground fault current interrupters and single-phase power normally found at residential locations.

The oil pump unit 34 and radiator/fan 36 also receive command signals from and send status signals to the motor controller 18. As will be described in more detail below, the oil pump unit 34 and radiator/fan 36 are part of a closed loop oil cooling system for the electric vehicle propulsion system 10.

The motor 28 is preferably a 3-phase AC induction motor having two identical, electrically isolated, windings per phase for producing high torque at zero speed to provide performance comparable to conventional gas-driven engines. The rotor (not shown) of the motor 28 is coupled to the vehicle transaxle (not shown). Preferably, the two windings in each phase of the motor 28 are aligned substantially on top of one another and are electrically in phase such that each winding provides approximately half the total power of the phase. Also the motor 28 is preferably completely sealed and utilizes spray-oil cooling to remove heat directly from the rotor and end windings to increase reliability.

The resolver 26 is positioned proximate to the motor 28 for detecting the angular position of the motor shaft and for providing signals indicative of the angular position of the motor shaft to the motor controller 18.

The resolver 26 can comprise a commercially available resolver or other resolver known in the art. Reference signals for the resolver 26 are provided by the motor controller 18.

The chassis controller 22 and the motor controller 18 receive signals from a vehicle communication bus. Generally, the vehicle communication bus serves as a communication pathway for interfacing various vehicle sensors and controllers to the chassis controller 22 and the motor controller 18, as will be explained in more detail below.

The chassis controller 22 comprises a microprocessor-based digital and analog electronics system and provides control and status interfacing to the vehicle's sensors and controllers and to the motor controller 18. For example, the chassis controller 22 is connected, via the vehicle communication bus, to the vehicle key switch, accelerator, brake, and drive selector switches. The chassis controller 22 interprets signals from these switches to provide the motor controller 18 with start-up, drive mode (e.g., forward, reverse, and neutral), motor torque, regenerative braking, shutdown, and built-in test (BIT) commands. Preferably, the chassis controller 22 communicates with the motor controller 18 via an opto-coupled serial data interface and receives status signals from the motor controller 18 of all the commands sent to verify the communication links between the chassis controller 22, the vehicle, and the motor controller 18 and to verify that the vehicle is operating properly. It should be appreciated that because the chassis controller 22 provides the control and status interfacing to the vehicle's sensors and controllers and to the motor controller 18, the electric vehicle propulsion system 10 can be modified for use with any number of different vehicles simply by modifying the chassis controller 22 for a particular vehicle.

The chassis controller 22 also provides battery management capabilities by using signals received over the vehicle communication bus from a battery current sensor located in the power distribution module 20. The chassis controller 22 interprets signals from the battery current sensor, provides charging commands to the motor controller 18, and sends a state-of-charge value to a "fuel" gauge on the vehicle dashboard. The chassis controller 22 further connects, via the vehicle communication bus, to vehicle controllers including odometer, speedometer, lighting, diagnostic and emissions controllers, as well as to an RS-232 interface for system development. As shown in FIG. 4, the motor controller 18 includes a low voltage power supply 42, an input filter and DC relay control unit 44, a vector control board 46, and first and second power bridges and gate drives 48 and 50, respectively.

The low voltage power supply 42 converts the 12 volt output from the DC/DC converter 38 to provide +5 V, +/−15 V, and +20 V outputs to the input filter and DC relay control unit 44, the vector control board 46, the first power bridge 48, and the second power bridge 50. The low voltage power supply 42 can comprise a commercially available power supply as is known in the art.

The input filter and DC relay control unit 44 includes electrical connections for coupling the 320 volt output of the power distribution module 20 to the first and second power bridges 48 and 50, respectively. The input filter and DC relay control unit 44 includes EMI filtering, a relay circuit for disconnecting the coupling of the 320 volt output of the power distribution module 20 to the first and second power bridges 48 and 50, respectively, and various BIT circuits including voltage sense circuits and a chassis ground fault circuit. Preferably, the input filter and DC relay control unit 44 receives control signals from and sends status signals, e.g., BIT signals, to the vector control board 46.

Each of the first and second power bridges 48 and 50, respectively, includes insulated gate bipolar transistor (IGBT) switching circuits and associated gate drive circuits for applying drive currents to each of the windings of the motor 28. Preferably, each of the first and second power bridges 48 and 50, respectively, provides half the current to the windings of the motor 28, thereby allowing the use of readily available, low cost IGBT switching circuits. The first and second power bridges 48 and 50, respectively, receive control signals from and send status signals, e.g., BIT signals, to the vector control board 46.

The vector control board 46 comprises a microprocessor based digital and analog electronics system. As its primary function, the vector control board 46 receives driver-initiated acceleration and braking requests from the chassis controller 22. The vector control board 46 then acquires rotor position measurements from the resolver 26 and current measurements from the first and second power bridges 48 and 50, respectively, and uses these measurements to generate pulse width modulated (PWM) voltage waveforms for driving the first and second power bridges 48 and 50, respectively, to produce the desired acceleration or braking effects in the motor 28. The PWM voltage waveforms are generated in accordance with a control program which is designed to result in a requested torque output. As described above, the vector control board 46 also has the function of controlling the input filter and DC relay control unit 44, the oil pump unit 34, the radiator/fan 36, the battery charger 16, the input filter and DC relay control unit 44, built in test circuitry, vehicle communication, and fault detection.

Figure 5:
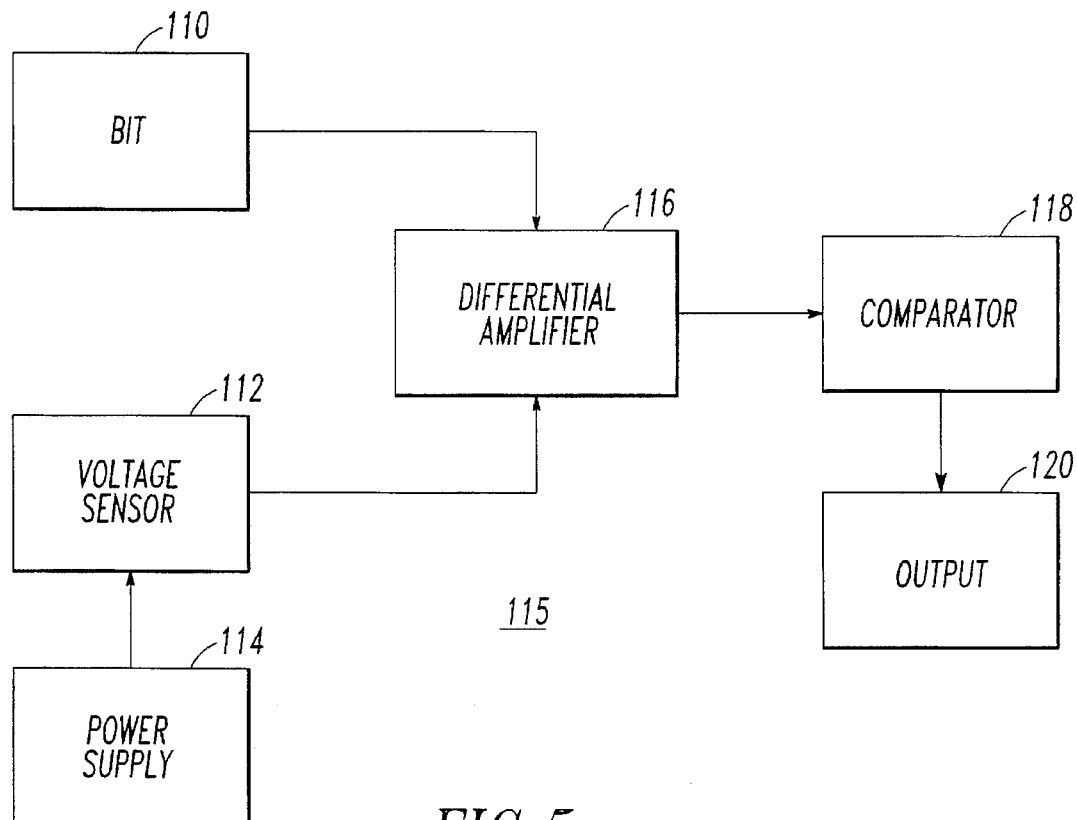
FIG. 5 is a block diagram of a preferred embodiment of the fault detection circuit of the present invention.

An exemplary embodiment of the fault detection circuit of the present invention is shown in FIG. 5, and is designated generally by the reference numeral 115. The fault detection circuit 115 is included in input filter and DC relay control unit 44 (FIG. 4). In accordance with the invention, the fault detection circuit 115 includes a voltage sensor 112, power supply 114, built-in test (BIT) 110, differential amplifier 116, comparator 118, and output 120.

The fault detection circuit of the present invention includes a voltage sensor which is coupled to a DC power source. The voltage sensor includes an analog reference representing a voltage at a chassis ground under normal operating conditions and the chassis ground.

As embodied herein and referring to FIG. 5, the voltage sensor 112 receives a high-power DC voltage from the power supply 114. The power supply 114 is a high-power DC voltage supply capable of supplying approximately 320 volts DC.

Figure 6:
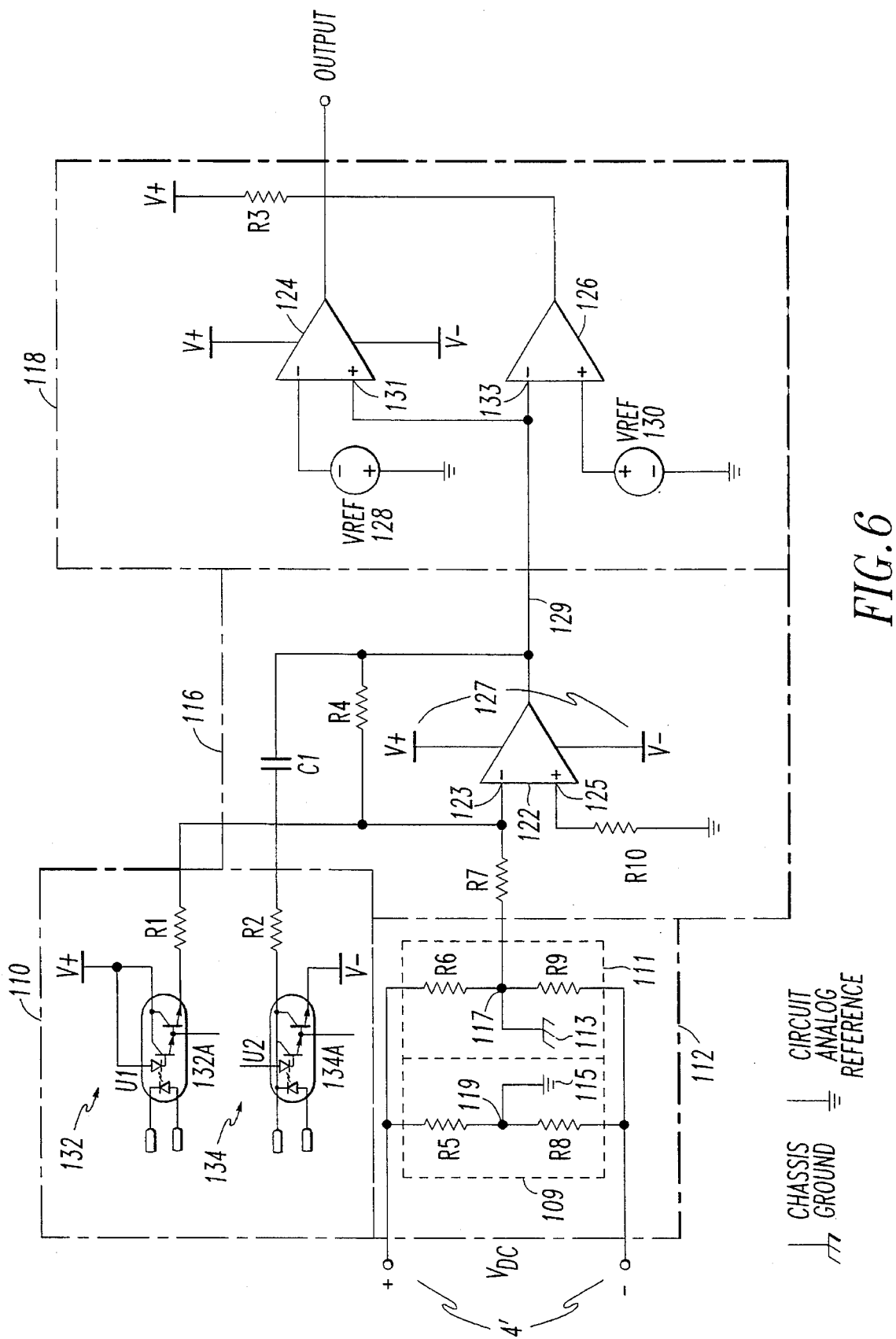
FIG. 6 is a detail circuit diagram of the fault detection circuit depicted in FIG. 5.

A detailed circuit diagram of the voltage sensor 112 is shown in FIG. 6. The voltage sensor 112 includes first and second voltage dividers 109 and 111, respectively. The first voltage divider 109 includes resistors R5 and R8 and the second voltage divider 111 includes resistors R6 and R9. A chassis ground 113 is tied to a junction 117 between the resistors R6 and R9 of the first voltage divider 109. A circuit analog reference 115 is tied to a junction 119 between the resistors R5 and R8. In the preferred embodiment, resistors R5, R6, R8 and R9 each have a resistance of 1 megohm, for example.

The first and second dividers are matched such that if there are no other impedances across the positive and negative terminals 114' of the DC power supply 114, the voltage difference between the two junctions, i.e., junction 117 corresponding to chassis ground and junction 119 corresponding to circuit analog reference will be zero. If a leakage occurs, however, between either voltage terminal 114' and the chassis of the vehicle, a voltage difference between the chassis ground 113 and the circuit analog reference 115 will develop.

The fault detection circuit of the present invention also includes a differential amplifier coupled to the voltage sensor for detecting variations in the analog reference and the chassis ground.

Referring to FIG. 6, the differential amplifier 116 includes an operational amplifier 122 which receives voltage of the chassis ground 113 at the inverting input through a resistor R7 (1 megohm, for example). The operational amplifier 122 receives the voltage of the circuit analog reference 115 at the non-inverting input 125 through a resistor R10 (20 kohms, for example). The operational amplifier 122 has a feedback from output 129 to the inverting input 123 through a resistor R4 (20 kohms, for example). A capacitor C1 (0.1 microfarad, for example) is connected to resistor R4 in parallel. The operational amplifier 122 is powered by positive and negative voltages (label 27) of ±15 volts, for example.

If a difference between the chassis ground voltage and the analog circuit reference voltage exists, the differential amplifier 116 detects this voltage difference from the different input voltages at the operational amplifier 122. The operational amplifier 122 outputs (at 129) a voltage signal corresponding to the difference in the input voltages.

The fault detection circuit of the present invention includes a voltage comparator unit for determining whether a magnitude of the variations detected in the differential amplifier is above a predetermined threshold value. The voltage comparator unit includes first and second comparators for comparing the voltage variations detected by the differential amplifier to a positive and negative threshold value, respectively.

Referring to FIG. 6, the voltage comparator unit 118 includes a first comparator 124 and a second comparator 126. The first comparator receives a voltage variation signal output from the differential amplifier 116 at a non-inverting input 131 while the second comparator receives the same voltage variation signal at inverting input 133. In other words, the non-inverting input of the first comparator 124 is connected to the inverting input of the second comparator 126.

The other inputs of the first and second comparators are connected to set voltage references which supply the threshold voltages. For example, the inverting input of the first comparator 124 is connected to reference voltage supply VREF 128 as a negative threshold voltage while the non-inverting input of the second comparator 126 is connected to reference voltage supply VREF 130 as a positive threshold voltage. The output of both comparators are shorted and tied to ±15 volts, for example, through a resistor R3. The first and second comparators are powered by positive and negative voltages of ±15 volts, for example.

Figure 7:
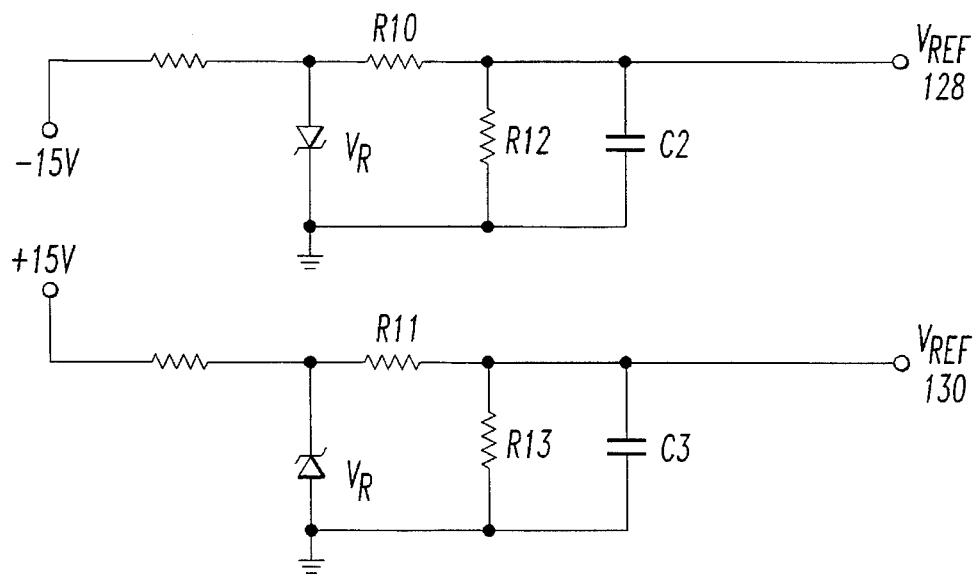
FIG. 7 is a detail circuit diagram of voltage references for the voltage comparator unit depicted in FIG. 5.

The reference voltage supplies VREF 128 and VREF 130 are shown in detail in FIG. 7. As shown in FIG. 7, the positive and negative voltage supply circuits each include a voltage regulator $V_R$ (5.1 volts, for example). The values for the resistors and capacitors shown in FIG. 7 are exemplary only and other suitable values may be used.

The fault detection circuit of the present invention includes a built-in test (BIT) circuit for testing whether the fault detection circuit is operating correctly. The BIT circuit is coupled to the differential amplifier and includes first and second sections for injecting first and second test signals to the differential amplifier.

Referring to FIG. 6, the built-in test circuit 110 provides test signals to the differential amplifier 116 to determine whether the circuit is operating correctly. The BIT circuit includes a first section 132 and a second section 134 which supplies the test signals. The first section 132, including optical coupler 132A, supplies positive test signals to determine whether the circuit is correctly detecting voltage variations that are greater in magnitude than the negative threshold voltage at the voltage comparator unit 118. The second section 134, including optical coupler 134A, supplies negative test signals to determine whether the circuit is correctly detecting voltage variations that are greater in magnitude than the positive threshold voltage at the voltage comparator unit 118.

The test signals are supplied from a controller in the electric car (not shown). When a test signal is applied to the BIT circuit, the voltage comparator unit 118 produces an output signal at 120 corresponding to the applied test signal. The output signal from the voltage comparator unit 118 is sent to the controller which compares the output signal to a known value corresponding to the particular test signal. The fault detection circuit operates correctly if the output signal matches the known value.

The controller tests the fault detection circuit by injecting the test signals to ensure that the circuit is operating correctly. If any of the test signals produces an error in the operation of the circuit, then the operator is notified of the fault condition in the circuit.

Now the operation of the fault detection circuit of the present invention will be explained with reference to FIG. 5.

The voltage sensor 112 receives a DC voltage of 320 volts. Under normal conditions, the chassis ground 113 and the circuit analog reference 115 in the voltage sensor 112 are matched and the differential amplifier 116 does not detect any voltage variation. However, if a leakage current flows (due to terminal corrosion or faulty circuit, for example) between one of the battery terminals (power rails) and the chassis of the vehicle, a difference in potential is created between the chassis and the other battery terminal to pose a dangerous condition. Immediately, the differential amplifier 116 detects this leakage current from the difference in voltages between the chassis ground and the circuit analog reference.

Once the leakage current is detected, the voltage comparator unit 118 determines whether the leakage current is at a dangerous level by comparing the corresponding voltage variation due to the leakage current to the positive and negative threshold values. If the leakage current is below the dangerous level, i.e., below the threshold values, then the voltage comparator unit 118 outputs a corresponding signal which informs the controller that the leakage current is not at a dangerous level. If, however, the leakage current is at or above the dangerous level, i.e., above the threshold values, then the voltage comparator unit 120 outputs a corresponding signal which informs the controller that the leakage current is at a dangerous level. The controller subsequently warns the operator of the dangerous condition.

When the fault detection circuit undergoes a built-in test operation, the circuit operates in a manner similar to monitoring the difference in voltages between the chassis ground and circuit analog reference, except that the voltage input of the chassis ground is substituted for the test voltage signal. Accordingly, to test whether the fault detection circuit correctly detects current leakages from the positive battery terminal, a test signal having a known response is applied to the differential amplifier 116 through the positive section 132 of the BIT circuit 110. To test whether the fault detection circuit correctly detects current leakages from the negative battery terminal, a test signal having a known response is applied to the differential amplifier 116 through the negative section 134 of the BIT circuit 110.

Accordingly, the fault detection circuit of the present invention detects current leakages from any one of the two isolated reference potentials to the chassis of a vehicle. If the leakage is at a dangerous level, the operator is notified of the dangerous condition. The present invention also ensures proper operation of the fault detection circuit through the built-in test circuit.

It will be apparent to those skilled in the art that various modifications and variations can be made in the fault detection circuit of the present invention without departing from the spirit or scope of the invention. Thus it is intended that the present invention cover the modifications and variations of this invention provided they come within the scope of the appended claims and their equivalents.

We claim:

1. An electric vehicle fault detection circuit for detecting leakage currents between a DC power source and a chassis of the vehicle, comprising:

a voltage sensor receiving voltages from the DC power source, said voltage sensor being connected to an analog reference and a chassis ground, said voltage sensor outputting a sensed analog reference signal and a sensed chassis ground signal;

a differential amplifier receiving said sensed analog reference signal and said sensed chassis ground signal from said voltage sensor, said differential amplifier detecting variations of said chassis ground signal from said analog reference signal and outputting a difference signal; and a voltage comparator unit receiving said difference signal, for determining whether a magnitude of said difference signal output from said differential amplifier exceeds a predetermined threshold value.

2. The fault detection circuit according to claim 1, further comprising a built-in test circuit supplying test signals exceeding said predetermined threshold for testing whether the fault detection circuit is correctly detecting variations and determining when a signal exceeds said predetermined threshold.

3. The fault detection circuit according to claim 2, wherein the built-in test circuit outputs test signals to the differential amplifier in place of said sensed chassis ground signal.

4. The fault detection circuit according to claim 3, wherein the built-in test circuit comprises:

a first input section for injecting a first test signal to the differential amplifier, in place of said sensed chassis ground signal; and a second input section for injecting a second test signal to the differential amplifier, in place of said sensed chassis ground signal.

5. The fault detection circuit according to claim 4, wherein the first and second input sections include optical couplers.

6. The fault detection circuit according to claim 1, wherein the voltage sensor comprises:

a first voltage divider having first and second resistors, the analog reference being connected at a junction of the first and the second resistors; and a second voltage divider having third and fourth resistors, the chassis ground being connected at a junction of the third and the fourth resistors, said first voltage divider and said second voltage divider being connected in parallel with each other and with the DC power source.

7. The fault detection circuit according to claim 6, wherein each of the first, second, third and fourth resistors of the first and second dividers has a resistance value approximately equal to one megohms.

8. The fault detection circuit according to claim 1, wherein the differential amplifier comprises:

an operational amplifier having inverting and non-inverting inputs;

a first resistor connected to the inverting input of the operational amplifier;

a second resistor connected to the non-inverting input of the operational amplifier;

a third resistor connected between the non-inverting input and an output of the operational amplifier; and a capacitor connected parallel to the third resistor.

9. The fault detection circuit according to claim 8, wherein the first resistor is approximately 1M ohms, the second resistor is approximately 20k ohms, the third resistor is approximately 20k ohms.

10. The fault detection circuit according to claim 8, wherein the capacitor has a value of approximately 0.1 microfarad.

11. The fault detection circuit according to claim 1, wherein the voltage comparator unit comprises:

a first comparator having first and second inputs for comparing the variations detected in the differential amplifier to a positive threshold value; and a second comparator having first and second inputs for comparing the variations detected in the differential amplifier to a negative threshold value.

12. The fault detection circuit according to claim 11, wherein the first comparator has a first reference voltage corresponding to the positive threshold value connected to the first input of the first comparator, the second comparator has a second reference voltage corresponding to the negative threshold value connected to the first input of the second comparator, and the second input of the first comparator is tied to the second input of the second comparator.

13. The fault detection circuit according to claim 1, wherein the DC power source is a high voltage battery.

14. The fault detection circuit according to claim 13, wherein the high voltage battery supplies approximately 320 volts.

15. The fault detection circuit according to claim 1, further comprising means for outputting a leakage current warning signal when said voltage comparator unit determines said difference signal exceeds said predetermined threshold.

16. A method of detecting leakage currents between a DC power source and a chassis of the vehicle comprising the steps of:

sensing an analog reference signal and a chassis ground signal;

detecting a difference between said analog reference signal and said chassis ground signal;

determining if a magnitude of said difference exceeds a predetermined threshold value; and outputting a leakage current warning signal when said predetermined threshold value is exceeded.

17. The method according to claim 16, further comprising supplying a signal exceeding said predetermined threshold to said determining step; and maintaining said outputting step to ascertain whether said determining step is being performed correctly.

18. The method as recited in claim 16, wherein said determining step comprises comparing said difference to a positive threshold value and comparing said difference to a negative threshold value.

19. The method as recited in claim 17, further comprising:

supplying a first signal exceeding said positive threshold value to said determining step;

supplying a second signal exceeding said negative threshold value to said determining step; and monitoring said outputting step to ascertain whether said determining step is being performed correctly.

\* \* \* \* \*